United States Patent [19]

Parker et al.

[11] Patent Number: 4,929,839
[45] Date of Patent: May 29, 1990

[54] FOCUSED ION BEAM COLUMN

[75] Inventors: Norman W. Parker, Westlake Villiage; William P. Robinson, Newbury Park, both of Calif.

[73] Assignee: MicroBeam Inc., Newbury Park, Calif.

[21] Appl. No.: 256,005

[22] Filed: Oct. 11, 1988

[51] Int. Cl.$^5$ .............................................. H01J 37/08
[52] U.S. Cl. .................................. 250/492.3; 250/358
[58] Field of Search ............ 250/396 R, 396 NL, 398, 250/492.21

[56] References Cited

U.S. PATENT DOCUMENTS

| 4,457,803 | 7/1984 | Takigawa ........................ 250/452.21 |
| 4,641,034 | 2/1987 | Okamura et al. ................... 250/358 |
| 4,757,208 | 7/1988 | McKenna et al. .................. 250/398 |

Primary Examiner—Bruce C. Anderson
Attorney, Agent, or Firm—Lyon & Lyon

[57] ABSTRACT

A focused ion beam optical column includes asymmetrical three-element electrostatic upper and lower lenses, a velocity filter, an electrostatic blanker, and an electrostatic octopole deflector for maskless ion implantation, resist exposure, repair of x-ray and photo masks, micromachining, and scanning ion microscopy and microanalysis. A constant and relatively high beam energy is maintained through the mass filter and blanker. The column produces a focused beam over a wide range of final beam voltages, with the particular voltage range determined by the dimensions of three components in the column. A large working distance between the main deflector and target is provided to allow for the insertion of imaging and/or charge neutralization optics.

2 Claims, 6 Drawing Sheets

FOCUSED ION BEAM COLUMN

BACKGROUND OF THE INVENTION

1. Field of the Invention

The present invention pertains to the field of focused ion beam systems. More particularly, the present invention pertains to the design of optical columns used to produce a focused beam of ions on the surface of a target, blank the beam on/off, and deflect the beam in a controlled manner across a target surface.

2. The Prior Art

There are numerous processes which can be performed using focused ion beams including: ion implantation, resist exposure, repair of x-ray and photo masks, micromachining, and scanning ion microscopy and microanalysis.

A typical example of the prior art is given in U.S. Pat. No. 4,563,587 "Focused Ion Beam Microfabrication Column". One key element of this reference is the requirement that the beam energy is not increased substantially by the low aberration focusing means. In fact, this reference states that the aberrations due to the mass filter are reduced by using lower beam voltages through the mass filter, when, in fact, the opposite is the case. Another feature of this reference is the positioning of an energy control means at the beam crossover. A pair of spaced electrodes functions as the final electrostatic focus/accelerating means, in which the beam must be accelerated substantially in order to achieve the required focusing action.

A second example of the prior art is U.S. Pat. No. 4,556,798 "Focused Ion Beam Column". A key element of this reference is the use of a second lens which is always accelerating. In addition, the deflection angle of the beam is specified not to exceed 10 mrad and the beam energy is required to increase through the first and second lenses at substantially operating equal ratios.

U.S. Pat. No. 4,479,060 "Apparatus for Irradiation with Charged Particle Beams" describes an ion column which includes at least one magnetic lens. U.S. Pat. No. 4,457,803 "Processing Method Using a Focused Ion Beam" describes a system in which the etching depth is preset in control device.

SUMMARY OF THE INVENTION

The invention allows the formation of a focused ion beam at the surface of a target. The beam can be blanked on and off rapidly and can also be deflected in a predetermined manner across the target surface in order to perform any of a number of different maskless processes. Typical applications are: ion implantation into semiconductors for maskless insertion of dopant species, exposure of resists used to define patterns on the surfaces of either photomasks or semiconductor wafers, repair of opaque defects in masks by sputtering away excess absorber material, repair of clear defects in masks by using the focused ion beam to catalyze a chemical vapor deposition process to deposit additional absorber material, micromachining of surfaces by physical sputtering or ion beam assisted etching, and microanalysis of materials by scanning the ion beam in a raster pattern to induce the emission of various secondary particles which are then collected to produce an image or other type of data display.

The present invention relates to a focused ion beam column with the capability to form a focused beam over a wide voltage range, over approximately 4 kV to 150 kV. For singly-charged ions, this voltage range corresponds to beam energies at the target over approximately 4 keV to 150 keV, while for doubly-charged ions the energies range over approximately 8 keV to 300 keV.

A second feature of the present invention is the large working distance below the column, sufficient to allow the insertion of additional optical elements (not shown and not part of the present invention) for imaging and/or charge neutralization. The large working distance is achieved through proper design of the lower lens in the optical column.

A third feature of the present invention is the use of a constant and relatively high voltage ion beam in the region between the exit of the upper lens and the entrance of the lower lens. One or more additional non-focusing optical elements, such as mass filters or blankers can be positioned within the constant voltage region. The operation of these additional elements is simplified by the use of a constant high voltage.

In addition, since the mass filter aberrations are proportional to $(\Delta V)/V$, where $(\Delta V)$ is the voltage spread of the ions in the beam and V is the average beam voltage, it is desirable to maximize V through the mass filter.

A fourth feature of the present invention is the capability to easily modify the optimized column operating voltage range by changing the dimensions of only three simple components in the column. The column can be optimized for low voltage ($\leq 60$ kV) operation applicable for mask repair, or for high voltage ($\leq 150$ kV) operation applicable for maskless implantation or ion beam lithography.

A fifth feature of the present invention is a design in which the third element of the lower lens and the main deflector are mechanically aligned with the remainder of the column using x-y precision motions. In some previous focused ion beam systems, the entire upper column including the ion source was moved relative to a fixed lens electrode, requiring a more complicated design. Alternatively, some other previous systems mounted the final electrode on long insulators in order to achieve sufficient voltage standoff, which is also more difficult design than in the present invention.

There are 12 major components included in the present invention. First, a liquid metal ion source is mounted at the top of the column. The ion source is mounted in an ion gun structure which provides rigid support, electrical and cooling connections, and an extraction electrode. Application of an extraction voltage of approximately $-5$ to $-15$ kV to the extraction electrode relative to the source tip induces field ionization from the source tip. The detailed design of the ion source and gun is not part of the present invention. The ion gun is mounted in a movable assembly, allowing x-y mechanical alignment with the column optical axis.

A beam-defining aperture is mounted below the ion gun to determine the fraction of the ion beam emitted by the gun which then passes into the remainder of the optical column. Small apertures reduce the beam current and also the beam diameter at the target. Larger apertures increase the beam current at the expense of larger beam diameters. At least two techniques can be used to change the aperture size. In one technique, the column can be constructed with a single aperture, which is chosen for the desired operating range. If a different range is subsequently required, the aperture can then be removed from the column and replaced with another. In an alternative technique, several apertures can be mounted on a movable structure, allowing any one of them to be positioned on the optical axis to function as the beam defining aperture. The exact method of aperture selection is not part of the present invention.

The upper electrostatic lens has three unequally-spaced electrodes with equal bore diameters. The beam voltage entering the upper lens corresponds to the extraction voltage (approximately 5 to 15 kV), while the exit voltage is fixed at approximately 30 kV. The focal length of the upper lens is adjusted to form an intermediate beam crossover at the plane of the mass separation aperture.

A mass filter is mounted below the first electrostatic lens. This mass filter utilizes crossed electric and magnetic fields to disperse ion species of differing masses into a series of separated beams. By proper selection of the magnetic and electric field strengths, only the desired ion species may be directed along the column optical axis, while all other species are directed away from the optical axis.

An electrostatic beam blanker is mounted directly below the mass filter. This beam blanker consists of two electrodes, used to form a dipole electric field for deflecting the ion beam away from the mass aperture. The blanker electrodes are of a low capacitance design, maximizing the achievable beam blank/unblank rate.

A mass separation aperture is mounted below the beam blanker. The mass aperture is centered on the optical axis and passes only beams directed parallel to this axis. Beams deflected off axis by either the mass filter or blanker do not pass through the mass separation aperture, and thus do not reach the target.

An upper deflector is mounted below the mass separation aperture, and consists of an electrostatic octopole used to generate a dipole electric field of variable magnitude and direction transverse to the beam axis. D.c. voltages can be applied to the octopole electrodes to deflect the beam onto the intermediate target and to align the beam with the lower lens.

The intermediate target is mounted below the upper deflector, and consists of an aperture centered on the column optical axis. In normal operation, the entire beam passes through the intermediate target aperture. During the initial setup of the mass filter and blanker, the upper deflector is used to deflect the beam off axis so that the beam no longer passes through the intermediate target aperture, instead striking the aperture plate.

A channel electron multiplier (CEM) is mounted directly above the intermediate target to collect secondary electrons generated by the impact of the beam with the intermediate target surface. The CEM thus provides an imaging signal during the process of adjusting the mass filter and blanker settings.

Ions passing through the intermediate target aperture enter the beam tube. This tube is fabricated from magnetic material and shields the ion beam from both magnetic and electric fields over the distance between the intermediate target and the lower lens.

The next component is the lower electrostatic lens, which has three unequally-spaced electrodes with equal bore diameters. The beam voltage entering the lower lens is always equal to the exit voltage from the upper lens, approximately 30 kV, while the exit voltage varies over approximately 4 kV to $V_{max}$, depending on the desired final beam voltage. In the low voltage column $V_{max}=60$ kV, while in the high voltage column $V_{max}=150$ kV. The lower lens focal length is adjusted to focus the beam at the final target surface. Mechanical positioning is used to align the third element of the upper lens with the axis of the optical column.

An electrostatic octopole deflector is mounted on the bottom of the third electrode of the lower lens and produces an electric field of variable strength and direction transverse to the beam axis. The electric field deflects the ion beam across the target surface in a controlled manner.

BRIEF DESCRIPTION OF THE TABLES

TABLE I lists the positions of the optical elements along the column optical axis.

TABLE II lists the preferred design parameters for the upper lens, which is identical for the first and second embodiments of the focused ion beam column.

TABLE III lists the preferred design parameters for the lower lenses in both the first and second embodiments of the focused ion beam column.

TABLE IV provides typical operating parameters for the first embodiment of the focused ion beam column at a final beam voltage of 30 kV.

TABLE V provides typical operating parameters for the second embodiment of the focused ion beam column over a range of final beam voltages from 4 to 150 kV.

DETAILED DESCRIPTION OF A PREFERRED EMBODIMENT

Figures 1, 1A:
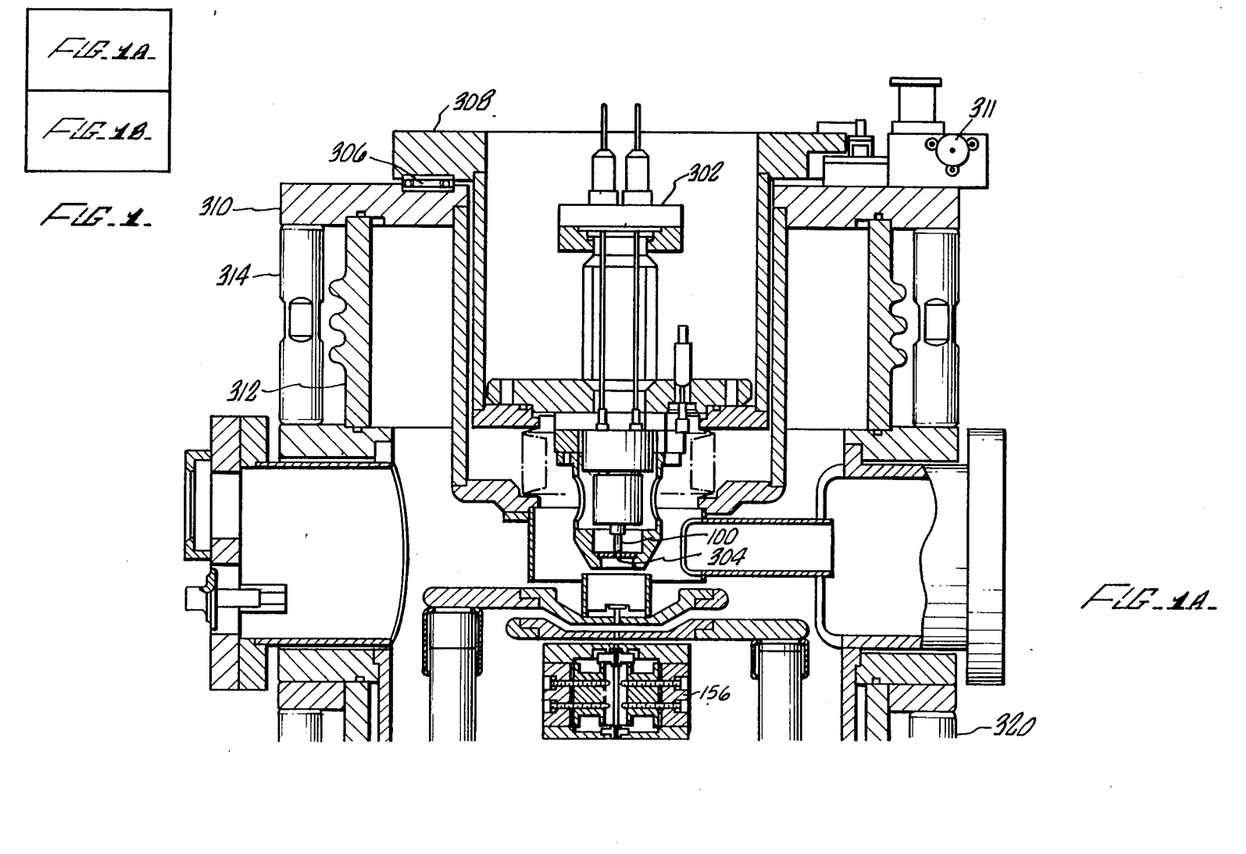
FIG. 1 comprising FIGS. 1a and 1b, together constitute a cutaway side view of the complete focused ion beam column and the column support structure and vacuum enclosure.
Figure 1B:
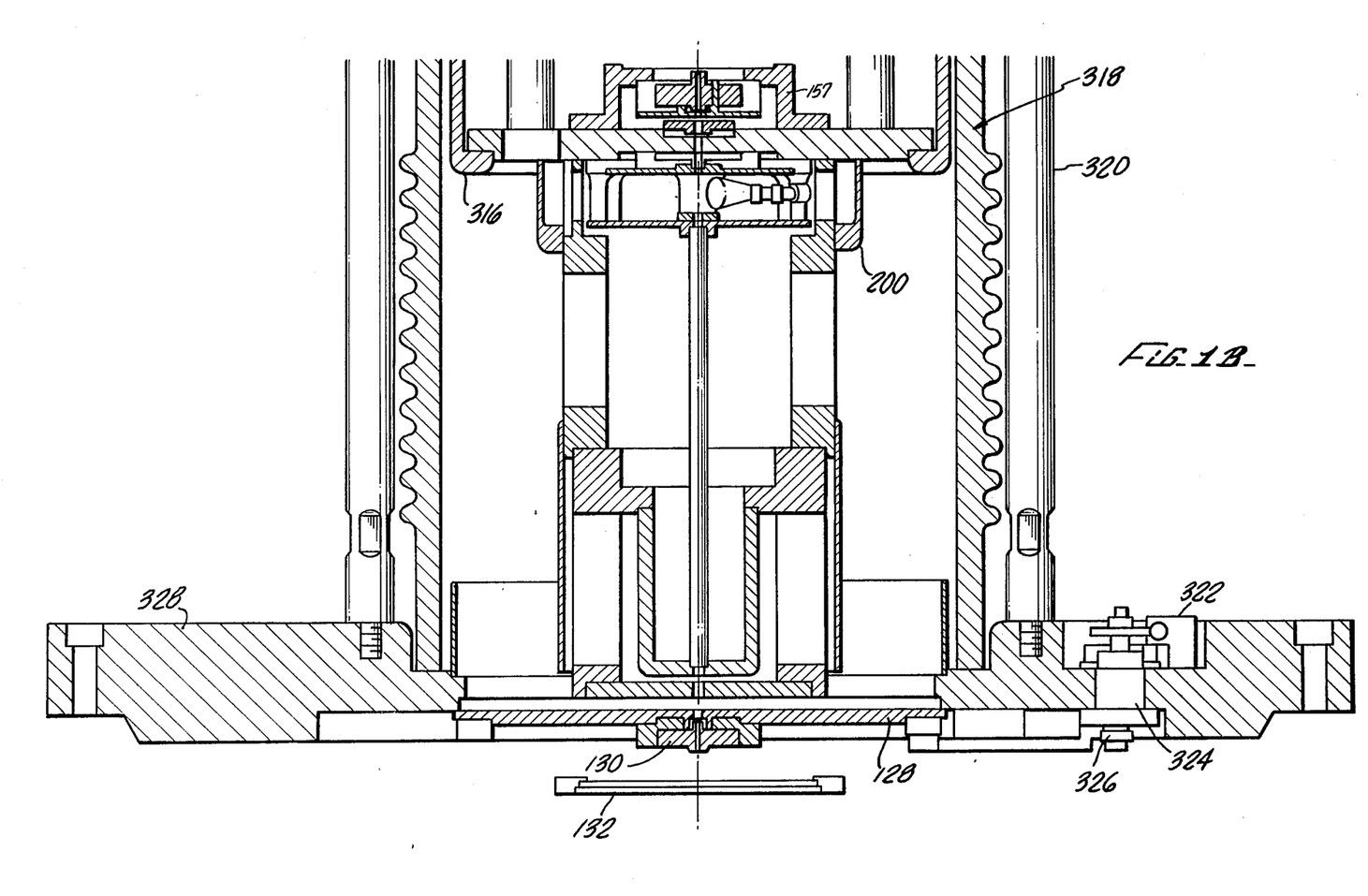

FIG. 1 comprising FIGS. 1a and 1b is an cutaway side view of the entire optical column and the column vacuum enclosure and supporting structure, showing the relationships of all elements. For clarity, the column will first be discussed in detail with respect to FIGS. 2–5 which illustrate various aspects of the present invention.

Figure 2:
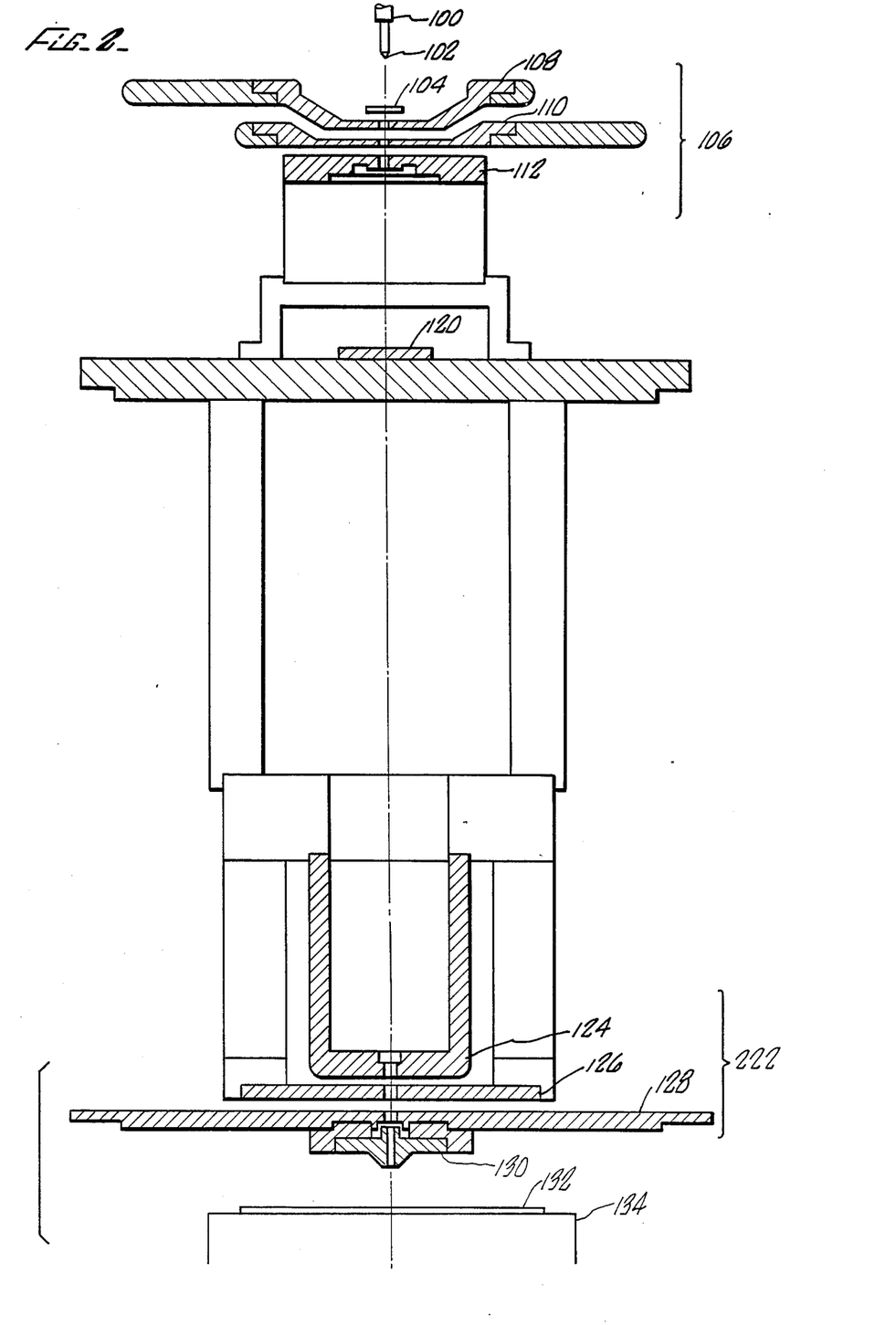
FIG. 2 is a side view of the optical elements of a first embodiment of the focused ion beam column of FIG. 1.

FIG. 2 is a side view of the beam focusing and main deflection elements in a first embodiment of the focused ion beam column. In the first embodiment, the column design is optimized for low final beam voltages, thus the first embodiment is hereinafter referred to as the low voltage column. Ions are emitted by an ion source 100 from a tip 102. The detailed design of the ion source 100 is not part of the present invention.

After passing through an extraction aperture (not shown for clarity), the size of the ion beam is determined by a beam-defining aperture 104. The ion beam subtends a half-angle at the tip, α, which is determined by the formula:

$$\alpha = r_{aperture}/d_{tip\ to\ aperture} \quad (eq.\ 1)$$

where $r_{aperture}$ is the radius of the beam-defining aperture and $d_{tip\ to\ aperture}$ is the distance from the source tip 102 to the beam-defining aperture 104. Only ions emitted from the source tip 102 within the angle pass through the beam-defining aperture 104. The total current in the beam is proportional to $\alpha^2$. The diameter of the beam at the target has a complex and generally familiar to those skilled in the art.

Ions within the angle α of the optical axis pass through the beam-defining aperture 104, entering an upper electrostatic lens 106, comprising a first electrode 108, a second electrode 110 and a third electrode 112. Preferred design data on the upper lens is given in Table II. The upper lens 106 forms an image of the source tip 102 at a mass separation aperture 120. The image is called the intermediate crossover.

A lower lens 122 comprises a first electrode 124, a second electrode 126, and a third electrode 128. The lower lens 122 images the intermediate crossover onto a target surface 132. Preferred design data on the lower lens is given in Table III. The overall magnification from the source tip 102 to target surface 132 is the product of the upper and lower lens magnifications which may be determined from the data in Tables I-III by known methods.

A main deflector 130 is an electrostatic octopole. The deflection electronics (not shown and not part of the present invention) applies controlled voltages to the eight octopole electrodes to create transverse dipole and quadrupole electric fields. The dipole field determines the amount of beam deflection across the target surface 132. The quadrupole field corrects astigmatism induced by imperfections in the optical elements and by deflection of the beam off-axis.

The target 132 is supported and moved under the ion beam by a target stage 134 (not part of the present invention).

Figure 3:
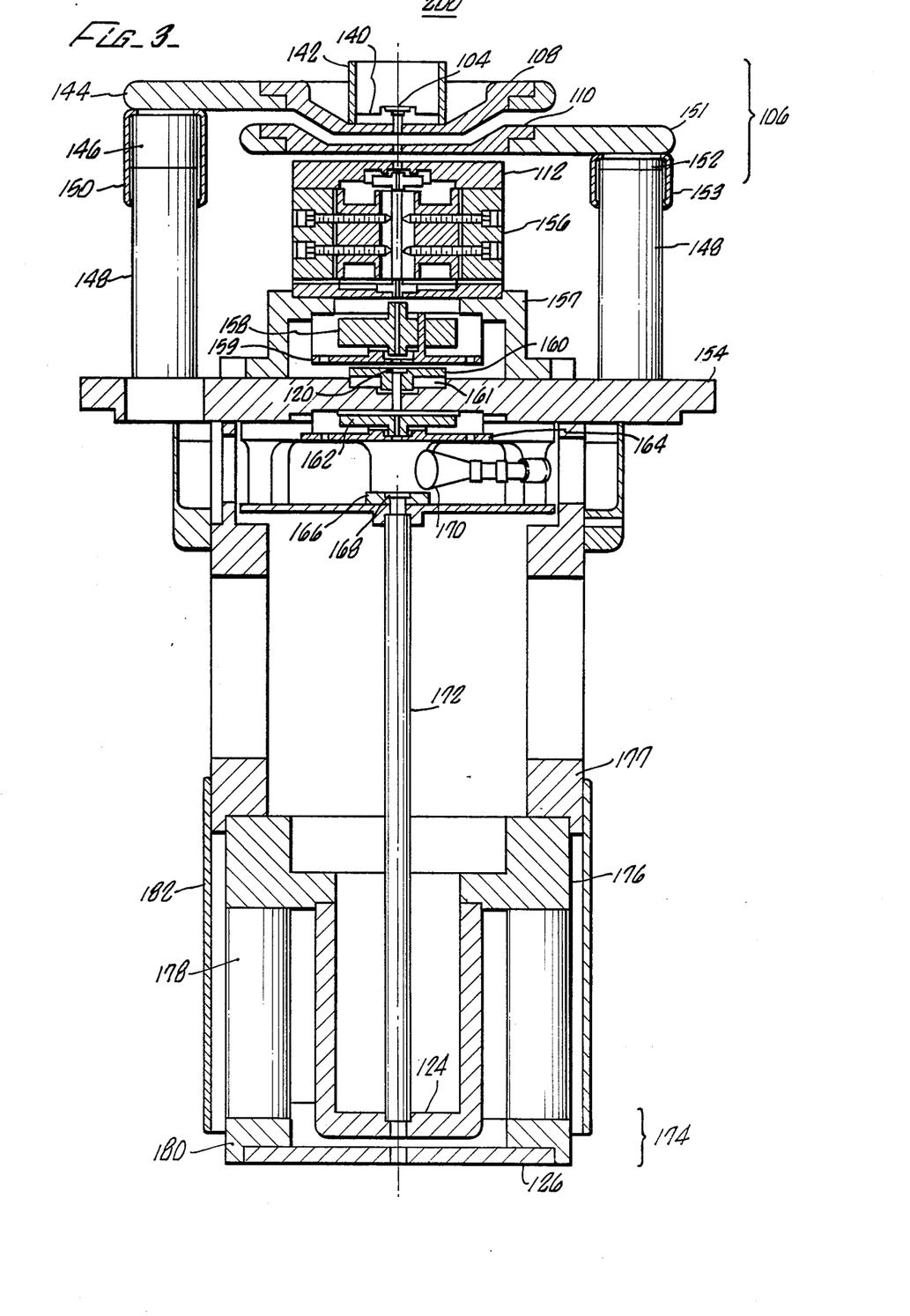
FIG. 3 is a cutaway side view of the first embodiment of the focused ion beam column of FIG. 1.

FIG. 3 is a cutaway side view of the low voltage column 200. Not shown are the ion source, the third electrode of the lower lens, the main deflector, and the target. The beam-defining aperture 104 is supported by an aperture mount 140. Impact of the ion beam with the beam-defining aperture 104 induces emission of secondary electrons. An aperture shield 142 prevents the secondary electrons from striking other surfaces in the system. The aperture mount 140 is attached to the first electrode 108 of the upper lens 106. The first electrode 108 is mounted on a support element 144, which has rounded edges to avoid high voltage breakdown. Three insulators 148 provide up to at least 30 kV of voltage standoff between a column support ring 154 and the first electrode 108. Three spacers 146 determine the proper vertical positioning of the first electrode 108. Three support assemblies each comprise one insulator 148 and one spacer 146. Each support assembly is shielded from the ion beam by a shield element 150. The support assemblies must be highly stable and rigid to maintain proper alignment of the first electrode 108 with the column axis.

The second electrode 110 of the upper lens 106 is mounted on a support element 151, which has rounded edges to avoid high voltage breakdown. Three insulators 148 provide up to at least 30 kV of voltage standoff between the column support ring 154 and the second electrode 110. Three spacers 152 determine the proper vertical positioning of the second electrode 110. Three support assemblies each comprise one insulator 148 and one spacer 152. Each support assembly is shielded from the ion beam by a shield element 153. The support assemblies must be highly stable and rigid to maintain proper alignment of the second electrode 110 with the column axis to within a concentricity of approximately 2 microns.

The third electrode 112 of the upper lens 106 is an integral part of a mass filter assembly 156. A support element 157 attaches the mass filter assembly 156 to the column support ring 154, maintaining proper alignment of the third electrode 112 and the mass filter assembly 156 with the column axis. A beam blanker 15 is also mounted on the support element 157. The blanker comprises two electrodes with opposite polarity voltages applied to generate a transverse dipole electric field which deflects the ion beam away from the mass separation aperture. A shield plate 159 reduces the electric fields from the blanker which penetrate to the mass separation aperture 120. Details of the design of the mass filter and blanker are not part of the present invention.

The ion beam is focused by the upper lens 106 into the plane of the mass separation aperture 120, supported by an aperture mount 160, which is insulated from the column support ring 154 by an insulator 161. A wire (not shown) may be attached to the aperture mount 160 to enable monitoring of that part of the ion beam which does not pass through the mass separation aperture 120.

An upper deflector 162 consists of an electrostatic octopole and is mounted underneath the column support ring 154. Control electronics (not shown and not part of the present invention) provide voltages to the eight octopole electrodes to generate a transverse dipole electric field for deflecting the ion beam off the optical axis, onto an intermediate target 168. The transverse electric field can also be used to align the ion beam with the axis of the lower lens 122. A shield plate 164 reduces the electric fields from the upper deflector 162 in the vicinity of the intermediate target 168.

The intermediate target 168 consists of a plate with a large diameter aperture (>250 microns), centered on the column axis. The intermediate target 168 is supported by a target mount 166, which keeps the intermediate target aperture in alignment with the optical axis. A channel electron multiplier (CEM) 170 is mounted above the intermediate target 168. When voltages are applied to the upper deflector 162, an electric field is induced which deflects the ion beam onto the intermediate target, causing emission of secondary electrons. The secondary electrons are collected by the CEM 170, providing an imaging signal which is used during initial setup of the mass filter 156 and the blanker 158.

After the ion beam passes through the intermediate target aperture, the ion beam enters a beam tube 172, which shields the beam from stray electric and magnetic fields. Shielding is necessary because exposing the beam to stray fields would cause unacceptable deflection and loss of resolution at the target surface 132. The exit of the beam tube 172 is at the bore of the first electrode 124 of the lower lens 122. The first two electrodes 124 and 126 of the lower lens 122 are called a high voltage lower lens assembly 174. The third electrode 128 of the lower lens 122 is at ground potential (0 V), and is not part of the column mechanical assembly shown in FIG. 3. Preferred design data for lower lens 122 is given in Table III. The first electrode 124 is attached to a spacer ring 176, which is mounted on a lower lens support cylinder 177. The first electrode 124 is at the same voltage as the column support ring 154, and thus requires no insulator.

The second electrode 126 of the high voltage lower lens assembly 174 is given at least 30 kV of voltage standoff by three insulators 178. Correct vertical positioning is determined by three spacers 180 with rounded edges to prevent high voltage breakdown. An electron shield 182 prevents the impact of stray electrons on the insulators 178 which could induce desorption of gas from the insulator surfaces, leading to high voltage breakdown.

Figure 4:
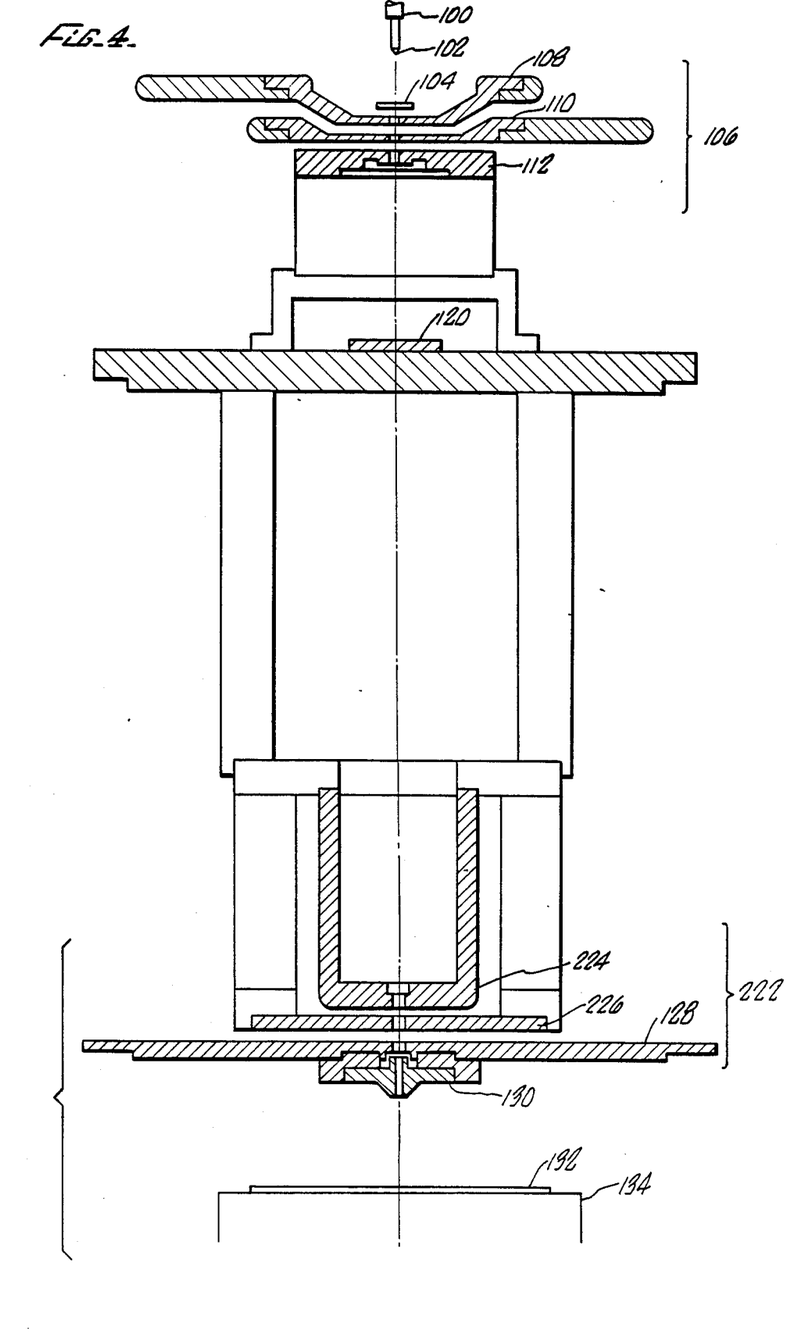
FIG. 4 is a side view of the optical elements of a second embodiment of the focused ion beam column of FIG. 1.

FIG. 4 is side view of the beam focusing and main deflection elements in a second embodiment of the focused ion beam column. In the second embodiment, the column design is optimized for high final beam voltages, thus the second embodiment is hereinafter referred to as the high voltage column. Down to the lower lens, the operation of the high voltage column is identical to the operation of the low voltage column described in FIG. 2. The only optical difference between the columns in FIGS. 2 and 4 is the spacings between the second and third electrodes of the lower lenses (122 in FIG. 2 and 222 in FIG. 4). The larger spacing in the high voltage column lower lens 222 allows a much higher voltage standoff between the second electrode 226 and the third electrode 128 than is possible between the second electrode 126 and the third electrode 128 in the low voltage column lower lens shown in FIG. 2. All lens electrode spacings are fixed for a particular column and can be changed only by removing the column from the vacuum enclosure and rebuilding the lower lens with differing components as described below. Preferred design data for the upper lens is given in Table II, while preferred data on the lower lens is given in Table III. Preferred data on the positions of the optical elements is given in Table I.

Figure 5:
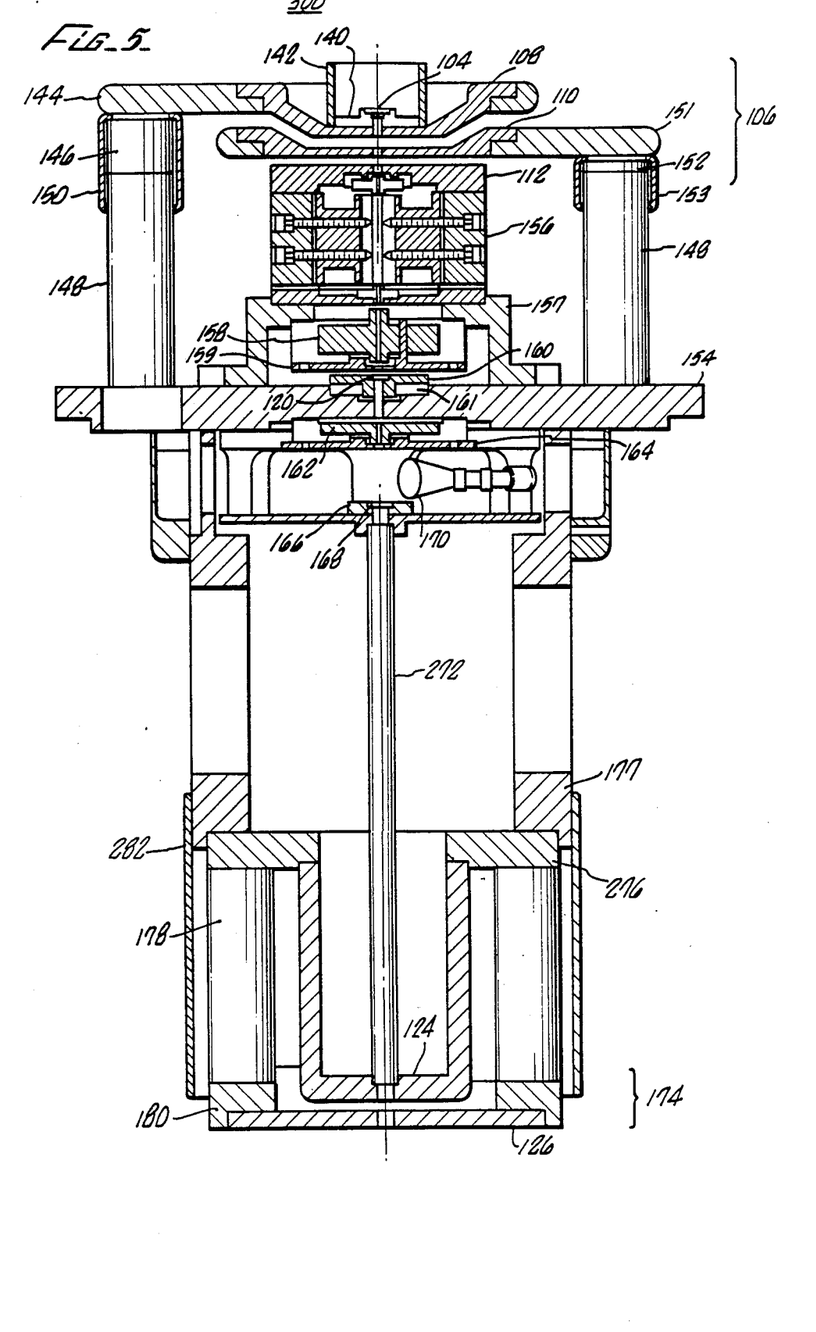
FIG. 5 is a cutaway side view of the second embodiment of the focused ion beam column of FIG. 1.

FIG. 5 is a cutaway side view of the high voltage ion column 300. The vertical positions of the first electrode 224 and the second lens electrode 226 are determined by the thickness of a spacer ring 276, which is thinner than the spacer ring 176 in the low voltage column shown in FIG. 2. The only differences between the high voltage column and the low voltage column shown in FIG. 3 for the embodiments described in Tables I-III are: spacer ring 276 is 22 mm thinner than spacer ring 176, beam tube 272 is 22 mm shorter than beam tube 172, and electron shield 282 is 22 mm shorter than electron shield 182. For embodiments optimized for other final beam voltages, these distances will be different and will be determined by the allowable maximum electric field strengths as is understood by those of ordinary skill in the art. A key feature of the present invention is the ability to tailor the optimum column performance range by this simple process of changing only three components in the column. This feature is a result of the optical design process used to design the present invention. A series of calculations showed that changing only the spacing between the second and third electrodes in the lower lens would give optimized performance over a range of final beam voltages. Previous column designs do not have this capability since a wide range of final beam voltage was not considered a critical design requirement. In particular, the development of finer semiconductor device geometries has reduced the allowable implantation depth for dopants. Shallower implant depths require lower ion energies, leading to the desirability of the lower voltages attainable in the present invention. In some cases, higher voltages are required, thus a high voltage beam-formation capability is still necessary. The only way to meet both these requirements with a single focused ion beam system is to use an optical design with a wide final beam voltage range.

FIG. 1 comprising FIGS. 1a and 1b, together constitute a cutaway side view of the complete focused ion beam column and the column support structure and vacuum enclosure. The ion source 100 is shown mounted in an ion gun assembly 302, with an extraction aperture 304. The ion gun assembly 302 is supported by a positioning assembly 308. The positioning assembly 308 is supported by three thrust bearings 306 and a top plate 310. Two motor-gearbox assemblies 311 provide x-y motions for the positioning assembly 308, allowing the ion source 100 to be aligned with the optical axis. The design of such gearboxes is well understood and beyond the scope of this invention. The top plate 310 is supported by an upper insulator 312, which is part of a vacuum enclosure and also provides at least 30 kV of voltage standoff. Six insulators 314 attach the top plate 310 to a feedthrough collar assembly 316.

The low voltage column 200 is supported and held rigidly in position by the feedthrough collar assembly 316, which is supported by a lower insulator 318, which is part of the vacuum enclosure and also provides at least 120 kV of voltage standoff. Six insulators 320 attach the feedthrough collar assembly to a target chamber top plate 328.

The third electrode 128 of the lower lens is moved in the transverse x-y directions by two motor-gearbox assemblies 322, each acting through a rotary feedthrough 324, to actuate a cam/cam follower assembly 326. The main deflector 130 is attached to the bottom of the third electrode 128. The target 132 is shown below the main deflector.

Although FIG. 1 shows the low voltage column 200, the high voltage column 300 can also be used with the system shown. Both columns 200 and 300 mount in the feedthrough collar assembly 316.

Figure 6:
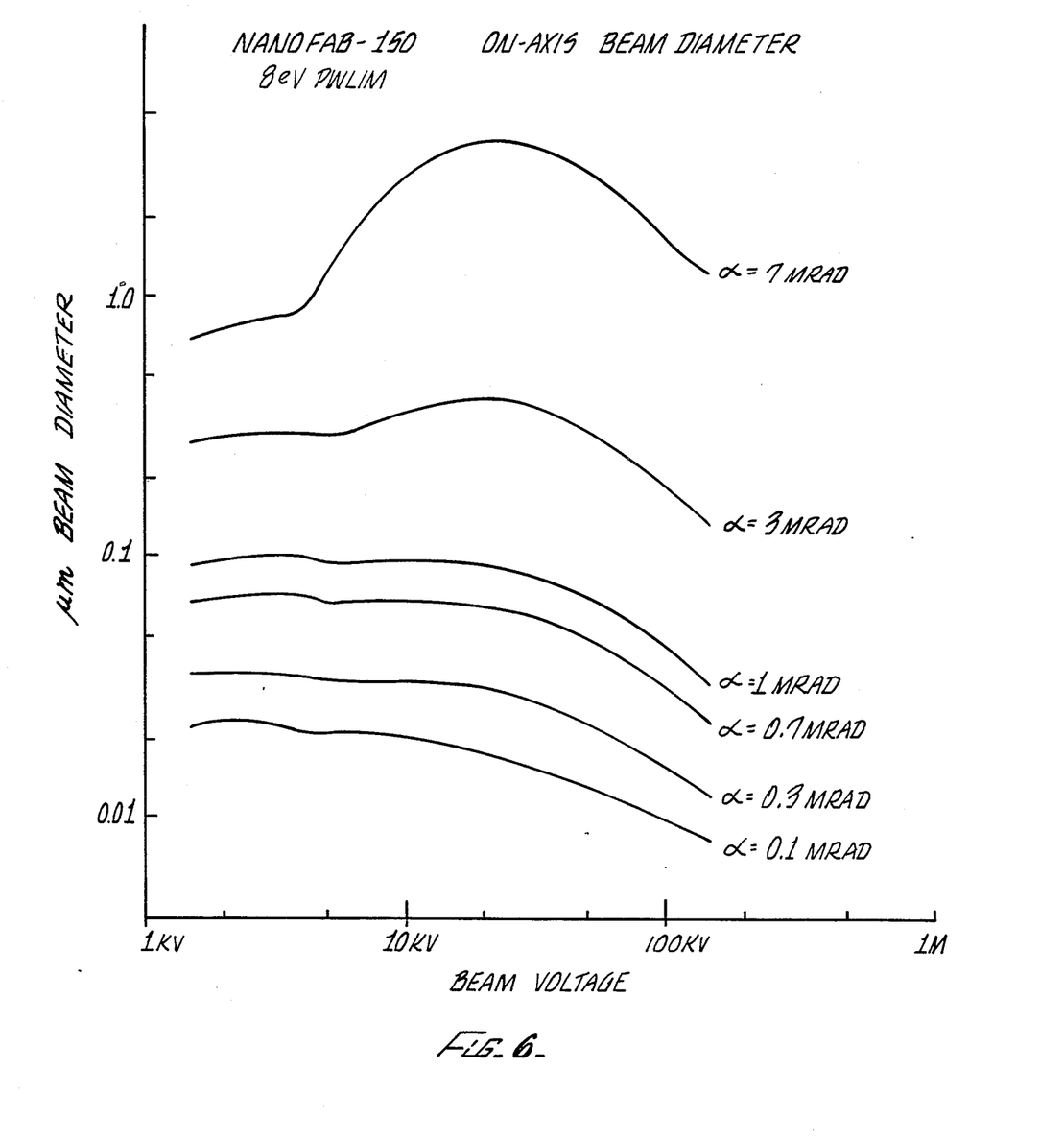
FIG. 6 is a plot of the optical performance of the second embodiment of the focused ion beam column of FIG. 1, showing the beam diameter at the target as a function of the beam voltage for various beam defining apertures.

FIG. 6 shows the beam diameter at the target as a function of the beam voltage for various beam half-angles $\alpha$, calculated for the high voltage optical column. For $\alpha < 1$ mrad, the beam diameter at the target is roughly independent of the beam voltage over approximately 1.5 kV to 20 kV, steadily decreasing for beam voltages above approximately 20 kV. For $\alpha > 1$ mrad, the beam diameter is largest for beam voltages near 20 kV, improving as the beam voltage is decreased or increased. Operation at low voltages allows very shallow ion implantation with minimized damage to the substrate lattice. Operation near 150 kV with doubly-charged ions gives ions with energies up to approximately 300 keV, causing very deep ion implantation.

Thus there has been shown and described a focused ion beam column which has a number of features. In prior art optical columns, changes in the source extraction voltage or the final beam energy required changes in the settings of all optical elements, including the mass filter. In the present invention, column setup is simplified since the mass filter settings are independent of both the source and target beam voltages. Prior art optical columns generally have limited final beam voltages due to restrictions in the focusing range of the final lens. The present invention has a wide voltage range due to the design of the lower lens, which can focus the beam at the target nearly independent of the final beam voltage. The design of the column allows it to be optimized for given predetermined final beam voltage range by proper choice of three simple components.

TABLE I
POSITIONS OF OPTICAL ELEMENTS IN THE COLUMN

| OPTICAL ELEMENT | LOW VOLTAGE COLUMN POSITION | HIGH VOLTAGE COLUMN POSITION |
|---|---|---|
| Ion Source | −30 mm | −30 mm |
| Beam-Defining Aperture | 0 mm | 0 mm |
| Upper Lens (front surface of 1st electrode) | 4 mm | 4 mm |
| Mass filter (center) | 49 mm | 49 mm |
| Beam Blanker (center) | 85.8 mm | 85.8 mm |
| Mass Separation Aperture | 100 mm | 100 mm |
| Intermediate Target | 152.5 mm | 152.5 mm |
| Lower Lens (front surface of 1st electrode) | 398 mm | 376 mm |
| Main Deflector (center) | 432 mm | 432 mm |
| Target Surface | 458 mm | 458 mm |

TABLE II
UPPER LENS DESIGN PARAMETERS (FOR BOTH LOW AND HIGH VOLTAGE COLUMNS)

| First Electrode | |
|---|---|
| position* | 4 mm |
| thickness | 3 mm |
| bore diameter | 3 mm |
| material | 304 stainless steel |
| Second Electrode | |
| position* | 12 mm |
| thickness | 3 mm |
| bore diameter | 3 mm |
| material | 304 stainless steel |
| Third Electrode | |
| position* | 19 mm |
| thickness | 3 mm |
| bore diameter | 3 mm |
| material | 304 stainless steel |
| Electrode Spacings | |
| 1st to 2nd electrodes | 5 mm |
| 2nd to 3rd electrodes | 4 mm |

*positions of electrode front surfaces relative to the beam-defining aperture (see Table I)

TABLE III
LOWER LENS DESIGN PARAMETERS

| | LOW VOLTAGE COLUMN | HIGH VOLTAGE COLUMN |
|---|---|---|
| First Electrode | | |
| position* | 398 mm | 376 mm |
| thickness | 5 mm | 5 mm |
| bore diameter | 6 mm | 6 mm |
| material | 304 stainless steel | |
| Second Electrode | | |
| position* | 407 mm | 385 mm |
| thickness | 6 mm | 6 mm |
| bore diameter | 6 mm | 6 mm |
| material | 304 stainless steel | |
| Third Electrode | | |
| position* | 418 mm | 418 mm |
| thickness | 4 mm | 4 mm |
| bore diameter | 6 mm | 6 mm |
| material | 304 stainless steel | |
| Electrode Spacings | | |
| 1st to 2nd electrodes | 4 mm | 4 mm |
| 2nd to 3rd electrodes | 5 mm | 27 mm |

*positions of electrode front surfaces relative to the beam-defining aperture (see Table I)

TABLE IV
LOW VOLTAGE COLUMN OPERATING PARAMETERS ELECTRODE VOLTAGES RELATIVE TO GROUND (in kV)

| Ion Source Tip | 30 |
|---|---|
| Extraction Electrode* | 21 |
| Upper Lens Electrodes | |
| 1st | 20 |
| 2nd | 19.1 |
| 3rd | 0 |
| Lower Lens Electrodes | |
| 1st | 0 |
| 2nd | 16.3 |
| 3rd | 0 |
| Target | 0 |
| Beam Voltage at Target | 30 |

*assumes an extraction voltage of 9 kV relative to the source tip. Generally, the extraction voltage ranges over approximately 5 to 15 kV, causing small variations in the required second electrode voltages in the the upper lens.

TABLE V
HIGH VOLTAGE COLUMN OPERATING PARAMETERS ELECTRODE VOLTAGES RELATIVE TO GROUND (in kV)

| Ion Source Tip | 5 | 10 | 30 | 50 | 110 | 150 |
|---|---|---|---|---|---|---|
| Extraction Electrode* | −4 | 1 | 21 | 41 | 101 | 141 |
| Upper Lens Electrodes | | | | | | |
| 1st | −5 | 0 | 20 | 40 | 100 | 140 |
| 2nd | −5.9 | −0.9 | 19.1 | 39.1 | 99.1 | 139.1 |
| 3rd | −25 | −20 | 0 | 20 | 80 | 120 |
| Lower Lens Electrodes | | | | | | |
| 1st | −25 | −20 | 0 | 20 | 80 | 120 |
| 2nd | −9.4 | −1.8 | 16.8 | 34.3 | 84.6 | 115.3 |
| 3rd | 0 | 0 | 0 | 0 | 0 | 0 |
| Target | 1 | 0 | 0 | 0 | 0 | 0 |
| Beam Voltage at Target | 4 | 10 | 30 | 50 | 110 | 150 |

*assumes an extraction voltage of 9 kV relative to the source tip. Generally, the extraction voltage ranges over approximately 5 to 15 kV, causing small variations in the required second electrode voltages in the upper lens.

We claim:

1. A focused ion beam column capable or operation over a wide range of final beam voltages, wherein the particular operating range can be changed by a sample modification of the column design, where a large working distance between the column and target surface allows for installation of imaging and/or charge neutralization optics, and comprising:

a high intensity ion source for emitting a first ion beam along the optical axis of said column, wherein said first ion beam may contain a plurality of ion species, a first electrode adjacent to said ion source for extracting ions from said ion source, a target onto which said ion beam is to be focused and scanned in a controlled manner, a beam-defining aperture for determining the acceptance angle of said ions into the portion of the column beyond said aperture, an upper focusing means for imaging said ion source into an intermediate crossover, and wherein the exit beam voltage relative to said ion source is kept constant and is substantially increased over the entrance beam voltage, independent of variations in said entrance beam voltage, a lower focusing means for imaging said intermediate crossover onto the surface of said target, wherein the entrance beam voltage relative to said ion source is kept constant end equal to said exit voltage from said upper focusing means, and the exit beam voltage is higher, lower, or equal to said entrance beam voltage, depending on the requirements for the final beam energy, said lower focusing means comprising an electrostatic round lens having first, second, and third electrodes, wherein the third electrode of said electrostatic round lens is movable in the x-y directions transverse to said optical axis to align said third electrode with the first and second electrodes of said electrostatic round lens, a constant high voltage enclosure between the exit of said upper focusing means and the entrance of said lower focusing means, wherein the beam voltage relative to the ion source is constant and equal to said exit voltage from said upper focusing means, a main deflector means for deflecting said ions in a controlled manner across said target surface.

2. A focusing ion beam column capable of operation over a wide range of final beam voltages, wherein the particular operating range can be changed by a simple modification of the column design, where a large working distance between the column and target surface allows for installation of imaging and/or change neutralization optics, and comprising:

a high intensity ion source for emitting a first ion beam along the optical axis of said column, wherein said first ion beam may contain a plurality of ion species, a first, electrode adjacent to said ion source for extracting ions from said ion source, a target onto which said ion beam is to be focused and scanned in a controlled manner, a first, beam-defining aperture for determining the acceptance angle of said ions into the portion of the column beyond said aperture, a first, upper, electrostatic round lens with first, second and third electrodes, for imaging said ion source into an intermediate crossover, wherein, the spacing in said upper lens between the first and second electrodes differs from the spacing between the second and third electrodes, and wherein the exit beam voltage relative to said ion source is kept constant and is substantially increased over the entrance beam voltage, independent of variations in said entrance beam voltage, and wherein the voltage on the middle electrode of said upper lens is varied to control the focal length, a second, mass separation aperture positioned in the plane of the intermediate crossover and centered on the optical axis of said ion column, a second, lower, electrostatic round lens with first, second and third electrodes, for imaging said intermediate crossover onto the surface of said target, wherein the entrance beam voltage relative to said ion source is kept constant and equal to said exit voltage from said upper lens, and the exit beam voltage is higher, lower, or equal to said entrance beam voltage, depending on the requirements for the final beam energy, and wherein the voltage on the middle electrode of said lower lens is varied to control the focal length, a constant high voltage enclosure between the exit of said upper lens and the entrance of said lower lens, wherein the beam voltage relative to the ion source is constant and equal to said exit voltage from said upper lens, an electrostatic octopole main deflector for deflecting said ions in a controlled manner across said target surface.

* * * * *